United States Patent [19]
Dunn

[11] Patent Number: 5,110,001
[45] Date of Patent: May 5, 1992

[54] HANDLE FOR WAFER CARRIER

[75] Inventor: L. Brian Dunn, Boise, Id.

[73] Assignee: Micron Technology, Inc., Boise, Id.

[21] Appl. No.: 665,198

[22] Filed: Mar. 4, 1991

[51] Int. Cl.$^5$ .......................................... B65D 25/28
[52] U.S. Cl. ................................. 220/94 R; 206/328; 294/33
[58] Field of Search ...................... 294/33; 220/94 R; 206/328

[56] References Cited

U.S. PATENT DOCUMENTS

| | | | |
|---|---|---|---|
| 3,701,558 | 10/1972 | Baker | 294/33 |
| 3,861,733 | 1/1975 | Vander Mey | 220/94 R |
| 3,923,191 | 12/1975 | Johnson | 220/94 |
| 3,926,305 | 12/1975 | Wallestad | 294/33 X |
| 3,939,973 | 2/1976 | Wallestad | 206/328 |
| 3,961,877 | 6/1976 | Johnson | 432/253 |

Primary Examiner—William I. Price
Attorney, Agent, or Firm—Albert M. Crowder, Jr.

[57] ABSTRACT

An improved handle for attaching to and supporting a wafer carrier is described in which robotic fixtures of the wafer carrier are utilized. The locking mechanism of the handle engages the robotic fixtures and then a configuration of flanges and shaped voids attaches to the robotic fixtures in a manner which is secure, even at elevated temperatures common to semiconductor manufacturing processes. Manipulation of the handle conveniently detaches the locking mechanism.

5 Claims, 6 Drawing Sheets

HANDLE FOR WAFER CARRIER

BACKGROUND OF THE INVENTION

1. Field of the Invention

Semiconductor wafers are routinely carried in wafer carriers or "boats" during various stages of their manufacture. The invention relates to a handle and, more particularly, a means at the bottom of the handle for grabbing and securely holding the wafer carrier.

2. Description of the Prior Art

Semiconductor wafers are the basic material upon which integrated circuit (IC) die are manufactured. The wafers are most commonly composed of pure, monocrystalline silicon and are normally very thin and generally round. Silicon wafers typically are on the order of one millimeter thick and have been manufactured in diameters from two to ten inches. They are rather fragile and expensive and are made more fragile and more valuable by stages of the IC production process.

During processing, it is necessary that wafers be contained within a vehicle which protects the wafers from contact with undesirable foreign matter and from contacting each other. At the same time, the vehicle must allow the wafers to be exposed freely in various baths and processes and the vehicle must be able to endure those processes. Such vehicles are well known in the art as wafer "baskets", "carriers", or "boats" Wafer carriers are described in U.S. Pat. No. 3,939,973 to Wallestad and U.S. Pat. No. 3,961,877 to Johnson. Typically the carriers have upright sides with slots configured to hold and properly space the wafers. The slot bottoms are partially closed to stop the wafers. The tops of the carriers are open for good access. The ends and bottoms of the carriers are closed sufficiently to give strength and rigidity but are sufficiently open to bathe the wafers quickly when immersed and allow them to drain when removed. The carriers are typically manufactured of temperature and chemical resistant plastic such as polypropylene and Du Pont Company's "Teflon" TM Wafer carriers for very high temperature applications are made of quartz.

Handles which may be conveniently and repeatedly attached and detached to such wafer carriers are highly desireable. They provide convenient means to transport the carriers and enable a handler to safely immerse and recover baskets from acid baths and various other processes. Handles representative of those used in semiconductor manufacture are described in U.S. Pat. Nos. 3,701,558 to Baker and 3,923,191 to Johnson. Compression of these handles will cause them to spread at their bases to receive and lock onto the carriers. Upward force, as is normal in carrying the handle and wafer carrier, causes the handle to press into the carrier and to enmesh the locking configuration of the handle legs into the receiving mechanism of the carrier. Handles, too, must be constructed of a material able to withstand very hot and/or corrosive conditions. The design and the material of the handle must cooperate so that the essential function is met and continues throughout the range of conditions to which the basket is subjected. Such handles are similar to those shown in FIG. 1.

The Semiconductor Equipment and Materials International (SEMI) Standards Program is an influential promulgater of standards for equipment used in the semiconductor industry throughout the United States, Asia, and Europe. SEMI standards have been widely adopted in the design of wafer carriers and SEMI specifications of automated usage fixtures for wafer carriers are the standard of the semiconductor manufacturing industry.

The object of this invention is the interconnection between the handle and the wafer carrier and, particularly, between the handle and the robotic fixtures of a SEMI standard wafer carrier. Carriers which will allow wafers to be transported and processed safely and routinely are well established in the art. Handles which allow baskets to be carried once a "lock" has been achieved, at room temperature, and without agitation or twisting movement are also available. There remains a need, however, for a mechanism which can be incorporated into handles otherwise conventional in the industry and which will reliably attach to and contain the mechanism of basket types conventional in the industry. A single failure which results in the destruction of a basket of wafers in an advanced state of manufacture could mean a loss measurable in thousands of dollars. Such losses have been known to occur, particularly in extreme conditions such as during an etching process when wafers, basket, and handle are subjected to hot acid. It is not uncommon for conventional locking devices to become pliable under such conditions and detach from the basket causing excessive etching and destruction of the wafer batch. The invention provides means of secure attachment of conventional handles and baskets, even when subjected to elevated temperatures and severe torque motion.

SUMMARY OF THE INVENTION

The inventive device provides a mechanism for securing carrying handles to wafer receptacles. The inventive device requires wafer carriers which are adapted for handling by automated equipment as specified by Semiconductor Equipment and Materials International, SEMI. The SEMI specifications set forth particular sets of flanges and slots to be built into the carriers for the purpose of accommodating robotics. The locking mechanism employs those particular flanges and slots as means for securing the handle in a safer and more reliable manner than has been done previously. The SEMI specifications have been widely adopted and wafer carriers employing those specifications for auto-usage are readily available. Reference is made particularly to the specification SEMI E1 STD.4-86.

Handles typically consist of a center grip structure constructed in two parts, two legs, and two locking mechanisms at the base of each leg. The difference of the inventive handle lies in the construction of the lock mechanisms which attach to the robotic fixtures of contemporary wafer carriers. The inventive device is suitable for adaption to existing handles by attachment of the inventive lock mechanisms or they may be molded as integrated units in new handles of otherwise traditional design.

The particular robotic fixtures specified by SEMI and necessary to the invention are essentially two pairs of flanges arranged to be perpendicular to each other. A first pair of flanges parallel to one another stand vertically; each capped by one of a second, horizontally-lying pair of flanges. This second pair of flanges is in-line with one another located above and perpendicular to the first pair of flanges. The lock-piece of the inventive handle is constructed to fit slidably around the first pair of flanges, the parallel, vertically standing flanges, so that lateral movement of the lock-piece is securely contained in any lateral direction. The lock-piece is free to slide to the top of the first, vertical flanges but is stopped there by the second, horizontal flanges. When the wafer carrier is set down and unweighted, the lock-pieces may be released by squeezing the handle and then sliding the lock-pieces vertically down and then horizontally away from the basket.

The lock-piece is constructed of a type and sufficient amount of material that it remains rigid at high temperatures. The balance of the handle must remain functional and resilient at that temperature. Du Pont PFA Teflon TM is suitable for temperature up to about 180° C. and polypropylene is suitable for use at up to about 70°; they are preferred materials of construction. An essential quality of the invention is the difference of rigidity required of three different areas of the one integral unit throughout the operating temperature range. The lock-pieces at either end of the handle must remain unyieldingly stiff while the connecting and carrying central portion of the handle must remain properly flexible to perform the spreading and carrying function.

Another essential quality of the invention is the simple and efficient manner in which the inventive lock-pieces exploit features of standard wafer baskets. The lock-piece at the bottom of each leg of the handle provides two slots. The open end of each slot faces the open end of a counterpart at the opposite end of the lock-piece. The slots are sized and configured to fit slidably on the vertical flanges and then butt into and be stopped by horizontal flanges. All the required flanges are normally molded into each end of contemporary wafer baskets. Once seated at the top of the vertical flanges, the natural outward springing action of the handle drives the top of the vertical flanges into a recess provided at each end of each lock-piece slot to further secure the attachment of the handle to the basket.

DESCRIPTION OF THE PREFERRED EMBODIMENT

Figure 1:
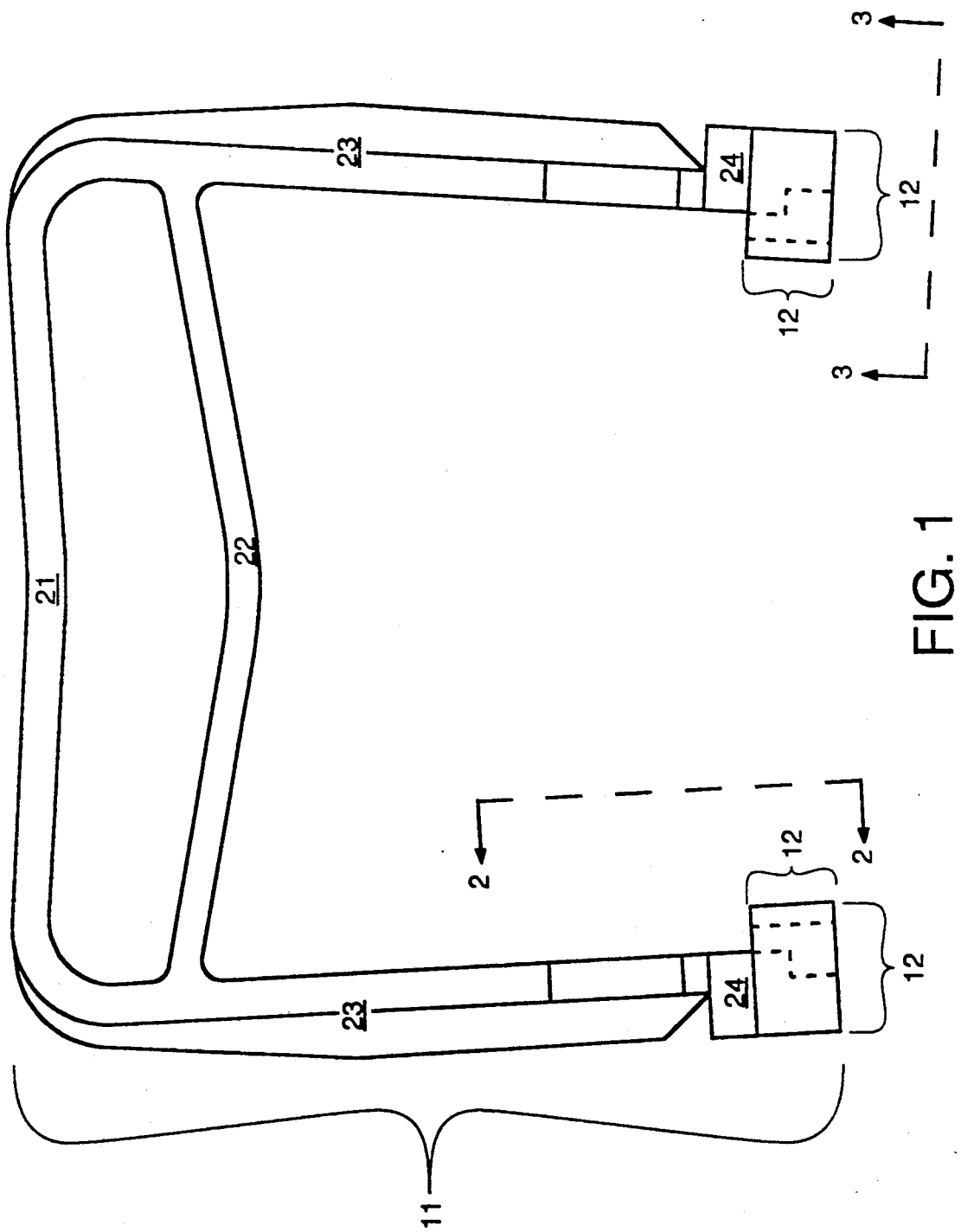
FIG. 1 is a front view of a typical handle similar to those described in U.S. Pat. Nos. 3,701,558 and 3,923,191. The view also shows the inventive lock-pieces in the bases of the handle legs for receiving and securing the wafer carrier.
Figure 2:
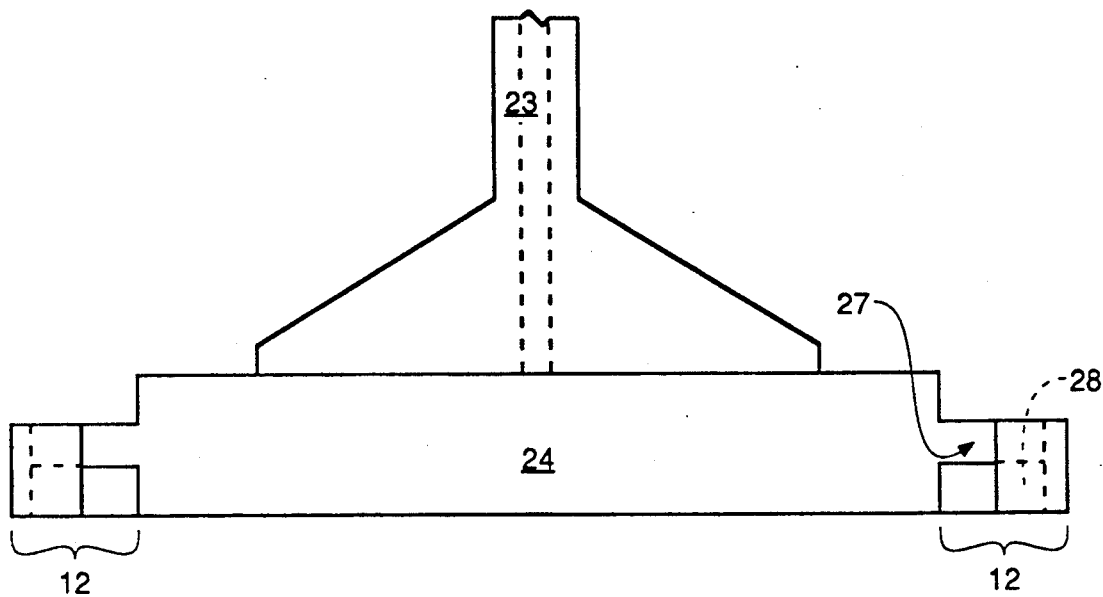
FIG. 2 is a side view of the base of one leg of the handle and the lock-pieces at each end of the base.
Figure 3:
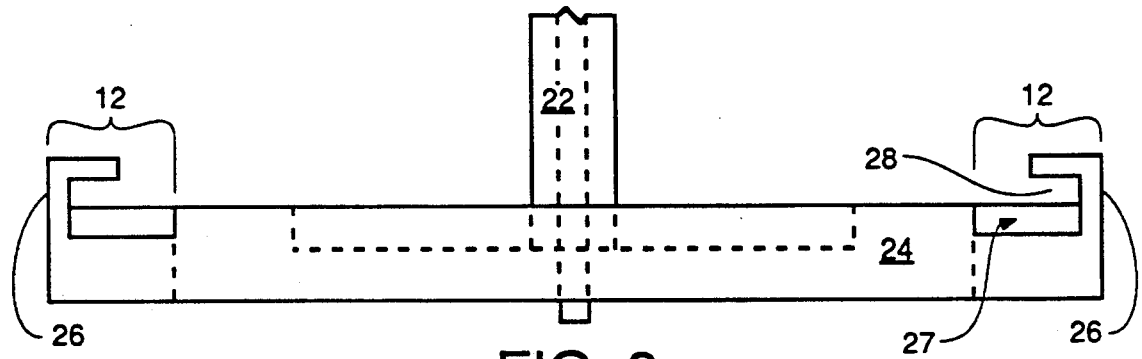
FIG. 3 is a view from below the handle base.
Figure 6:
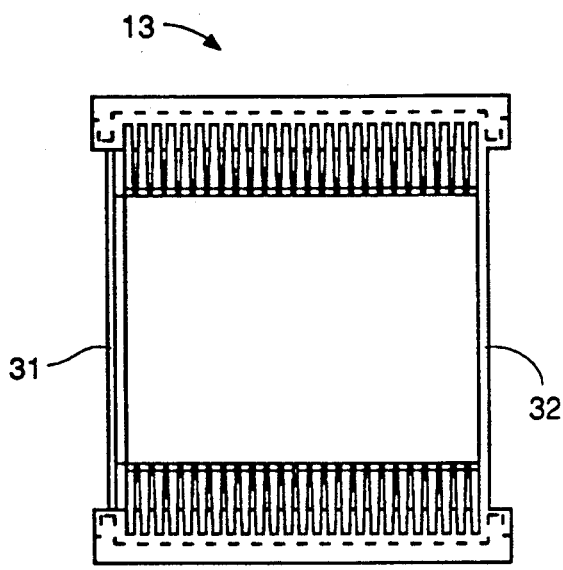
FIG. 6 is a top view of a SEMI compliant wafer carrier.
Figure 4:
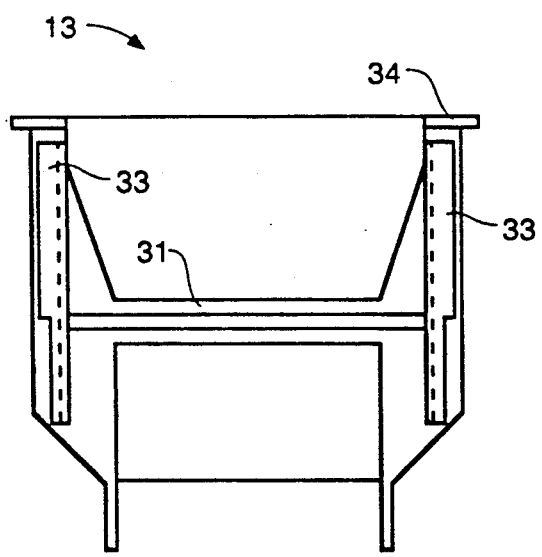
FIG. 4 is an end view of the bar end of a SEMI compliant wafer carrier.
Figure 5:
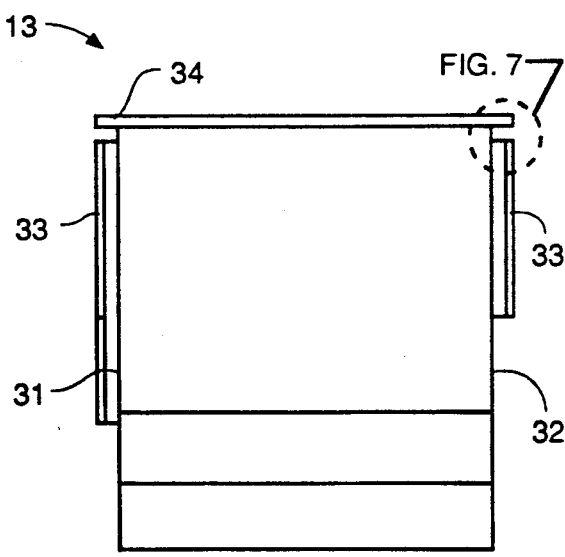
FIG. 5 is a side view of a SEMI compliant wafer carrier.

Referring to FIGS. 1-3, the present invention is of a handle 11 including lock-pieces 12 to securely attach and support a wafer basket 13 (FIGS. 4-6). Referring again to FIGS. 1-3, said lock-pieces 12 may be attached onto or molded into an otherwise conventional handle 11. Said handle 11 as illustrated is similar to those referenced above and is typical of those in common use in the semiconductor manufacturing industry. The handle 11 is comprised of a pair of transverse members, an upper member 21 and a lower member 22, a pair of vertical legs 23, and a base 24 at the bottom of each leg 23. At both ends of each base 24 is located the inventive lock-piece 12.

Each of the four lock-pieces 12 consists of a configuration of shaped voids and flanges which interact with counterpart flanges and voids of a wafer carrier 13 (FIGS. 4-6) discussed below. FIGS. 1-3 illustrate the elements of the lock-pieces 12. An angular U-shaped horizontal containment flange 26 extends from the base 24, turns inward 90° toward the opposite base, and then bends another 90° toward the counter-part lock-piece 12 at the opposite end of the same base. This flange 26 securely limits horizontal movement of the wafer carrier 13 relative to the handle 11 when the two are attached. A connecting portion of the lock-piece 12 between the horizontal containment flange 26 and the base 24 is identified as the vertical rest plate 27. A shaped void recess 28 is located below the vertical rest plate 27 and interior to the horizontal containment flange 26.

Referring now to FIGS. 4-6, wafers carriers 13 amenable to the inventive method must have auto-usage (also known as robotics) capability similar to that specified by Semiconductor Equipment and Materials International, SEMI. Reference is made particularly to slots and flanges for automated handling of the type described in the SEMI standard "E1 STD.4-86" for "125 mm PLASTIC AND METAL WAFER CARRIERS, AUTO TRANSPORT USAGE." Additionally, the auto-usage capability must be present at two opposite ends of the wafer carrier 13. Wafer carriers with auto-usage capability at two ends, such as the Fluoroware A194 Series, available from Fluoroware, Inc., 102 Jonathon Blvd. North, Chaska, Minn., 55318, are currently available and widely used.

Figure 7:
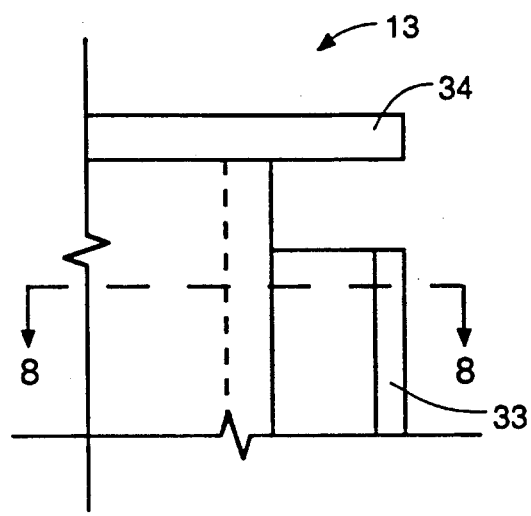
FIG. 7 is a detail of FIG. 6 showing an expanded view of a SEMI standard "pickup flange."
Figure 8:
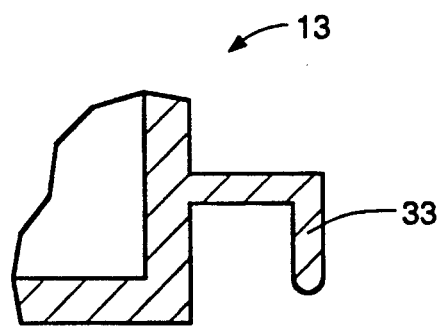
FIG. 8 is a detail of FIG. 5 showing an expanded view of a SEMI standard "handling slot."

Robotics capability compliant with SEMI specifications is illustrated as located on a auto-usage wafer carrier (also known as a "boat") in FIGS. 4-6. Details of the auto-usage flanges and slots are shown in FIGS. 7 and 8. The necessary flanges and slots exist as two co-acting pairs on both the bar end 31 and the end wall 32 (FIGS. 6 & 7). A first pair of vertically-standing flanges and co-existent slots, referred to as pickup flanges 33 in SEMI specifications, is arranged to stand parallel relative to each other near opposite sides of the boat and to open outwardly away from the boat. A second pair of flanges and co-existent slots, referred to as handling slots 34 in SEMI literature, are configured to lie horizontally in-line relative to each other and to be located directly above a vertical pickup flange 33.

Figure 9:
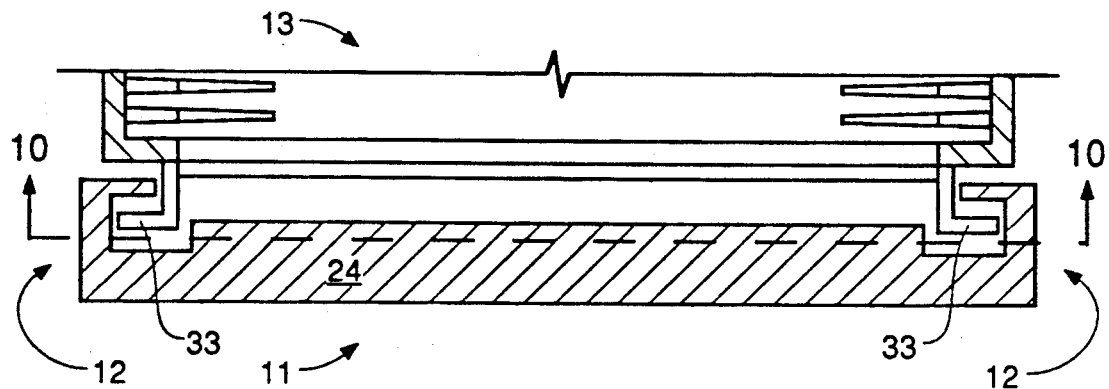
FIG. 9 is a plan view of the inventive lock-piece engaged about the robotic "pickup flange."
Figure 10:
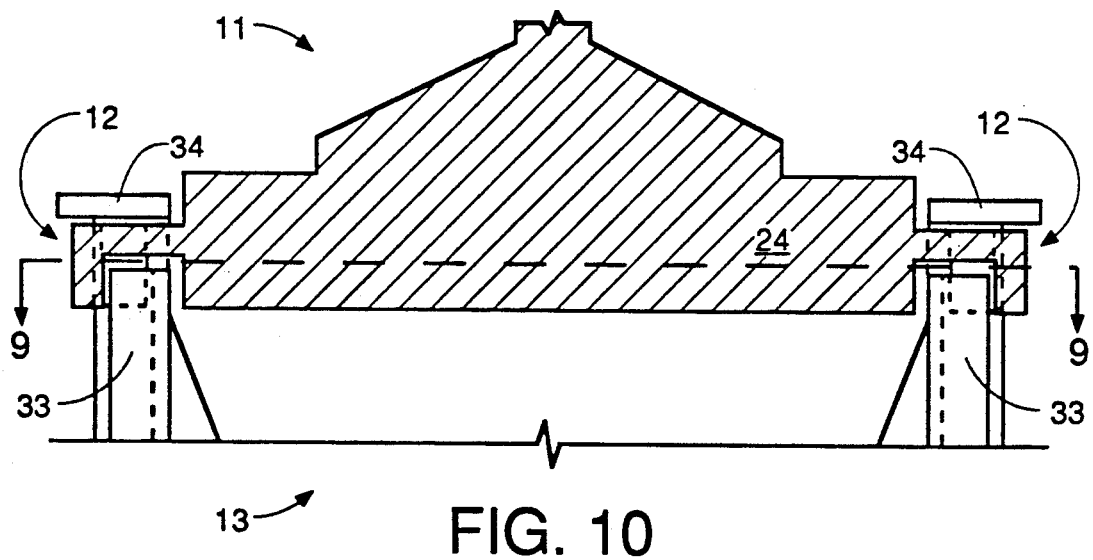
FIG. 10 is a sectional view of FIG. 9 illustrating the relationship of the inventive lock to the "handling slots" and the "pickup flanges" in the carrying position.
Figure 11:
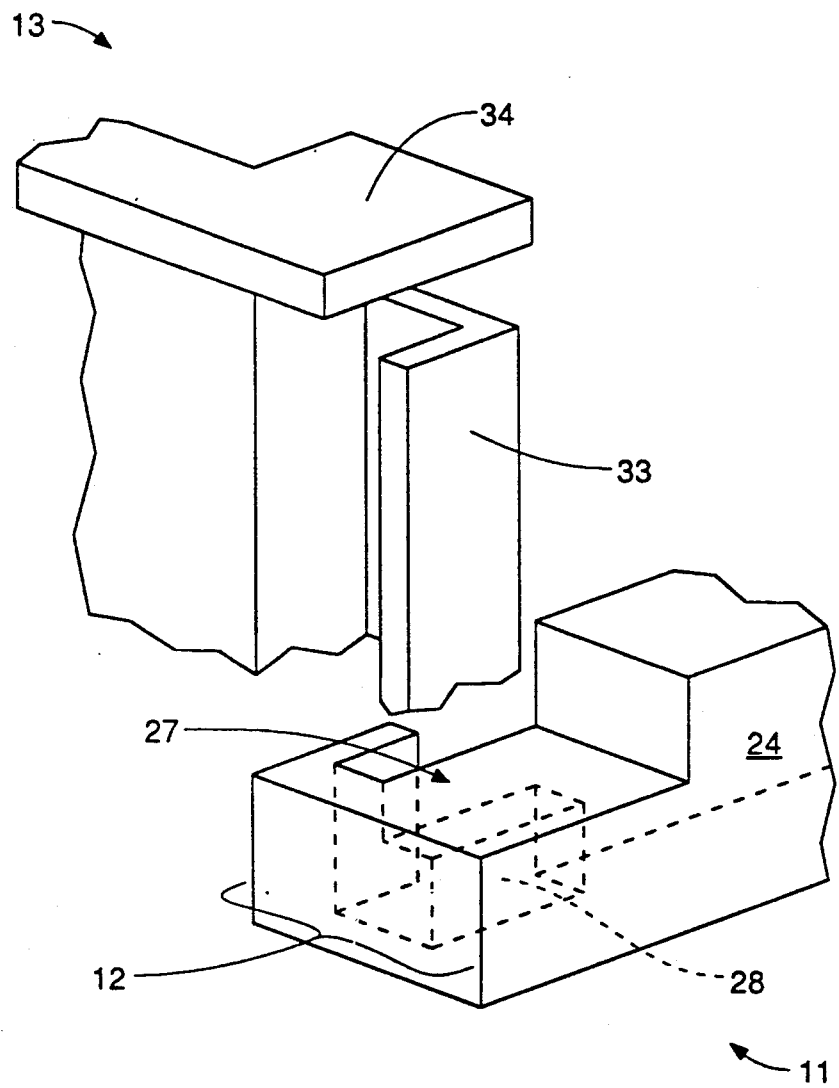
FIG. 11 is an isometric view of the inventive lock-piece engaging robotic fixtures of the wafer carrier.

Referring now to FIGS. 9-11, the inventive handle 11 is affixed to the robotic flanges 33 & 34 by first aligning the bases 24 of the handle 11 parallel to the bar end 31 and end wall of the boat 13 and positioning the bases 24 below the pickup flanges 33. This is simply done by compressing together the transverse members 21 & 22 of the handle and, thus, spreading legs 23 and allowing the bases 24 to pass over the boat 13. Then relaxing the pressure allows the legs 23 to return to a near normal position and allows the bases 24 and attendant lock-pieces 12 to rest against ends 31 & 32 of the boat 13 below the pickup flanges 33. This ability to flex and spread is well known in prior art. The difference of rigidity required of three different areas (transverse members, legs, and bases) of the one integral unit, however, throughout the operating temperature range is an essential quality of the invention. The lock-pieces at either end of the handle must remain unyieldingly stiff while the connecting and carrying central portion of the handle must remain properly flexible to perform the spreading and carrying function. Another essential quality of the invention is the adaption of the traditional handles to robotic capability of certain boats for their efficient and secure attachment.

This attachment is achieved by pulling the handle 11 upward from the above-described position and causing the inventive lock-pieces 12 to approach and engage the pickup flanges 33 of the boat 13. The horizontal containment flanges 26 of the lock-piece 12 operate to securely restrain lateral movement of the pickup flanges 33 relative to the handle but allow vertical movement of the base 24 and lock-pieces 12. As the handle 11 continues to be moved upward, the vertical rest plate 27 of the lock-piece 12 will engage the handling slots 34 of the boat 13. This engagement will stop the relative upward movement of the handle 11 and further upward movement will cause the boat 13 to be lifted. At approximately the position at which the relative upward movement is stopped, the lock-piece recess 28 will pass over the top of the pickup flange 33. Spring action of the handle 11 which seeks to move the bases 24 toward each other will cause the lock-piece to move inward an additional distance so that the pickup flange 33 seats within the recess 28. In that position, the top of the recess 28 will rest on the top of the pickup flange 33 and the handle 11 will be restrained from downward movement relative to the boat 13.

The combination of inventive lock 12 on a traditional handle 11 applied to standard automated usage accessories 33 & 34 will conveniently and effectively restrain movement in every direction. The new design also enables the base 24 and elements of the lock-piece 12 to be very much thicker and consequently more rigid than was possible in prior art. The security of attachment is greatly enhanced by the increased mass of the base 24 and lock-piece 12, particularly in the vertical direction and particularly at elevated temperatures which such devices commonly experience. Because the mass of the handle can be increased, harder or metallic materials are not necessary to improve the attachment, the handle and lock-pieces may be molded of conventional materials such as Du Pont Teflon ™ (polytetrafluoroethylene) or polypropylene. Du Pont PFA Teflon ™ is suitable for temperature up to about 180° C. and polypropylene is suitable for use at up to about 70°.

Clearly, the above description is of a specific embodiment of the invention. It is possible to embody the inventive concept in a variety of physical dimensions. It is also possible to fabricate the invention of many different materials. Accordingly, the invention should be read as limited only by the appended claims.

I claim:

1. An attachable and detachable handle for an automated-usage wafer carrier, comprising:
   two elongated bases for spacing and rigidly supporting a pair of lock-pieces on each base,
   two legs attached to said bases,
   two transverse members attached to said legs for spanning the wafer carrier and expanding said legs by compressing together said transverse members, and
   means for slidably attaching said handle to automated-usage fixtures at two ends of the wafer carrier by locating said lock-pieces at opposite ends of said elongated bases, each lock-piece including a generally U-shaped flange, each flange opening inward and toward the center of the base and forming a vertical slot slightly wider than the thickness of a SEMI (Semiconductor Equipment and Materials International) standard automated-usage pickup flange and said vertical slots at each end of said base being slightly farther apart than said SEMI pickup flanges.

2. An improved wafer carrier handle as in claim 1 wherein each said U-shaped flange includes:
   a flat seat above each U-shaped flange for supporting a wafer carrier in the vertical direction, and
   a shaped recess below each U-shaped flange for receiving one of said pickup flange and further restraining the movement of said pickup flange.

3. An improved wafer carrier handle as in claim 2 wherein each U-shaped flange is:
   an angular horizontal containment flange having a first extension extending at 90° inward from said base end toward the opposite base and terminating with a second extension, the second extension bending 90° toward the opposite end of the base, thereby forming a substantially U-shaped slot to fit slidably about and contain said automated-usage pickup flange,
   a flat vertical rest plate formed atop said horizontal containment flange for vertically supporting and lifting automated-usage handling slots, and
   a shaped void recess contained within said horizontal containment flange and below said vertical rest plate for further restraining said automated-usage pickup flanges.

4. An improved wafer carrier handle as in claim 1 wherein each of said means for slidably attaching to automated-usage fixtures of said wafer carrier is:
   an angular horizontal containment flange having a first extension extending at 90° inward from said base end toward the opposite base and terminating with a second extension, the second extension bending 90° toward the opposite end of the base, thereby forming a substantially U-shaped slot to fit slidably about and contain said automated-usage pickup flange,
   a flat vertical rest plate formed atop said horizontal containment flange for vertically supporting and lifting automated-usage handling slots, and
   a shaped void recess contained with said horizontal containment flange and below said vertical rest plate for further restraining said automated-usage pickup flanges.

5. An automated-usage wafer carrier and improved attachable and detachable handle in combination:
   the wafer carrier having generally upright sides and end walls, an open top, a drainable bottom, transverse slots for holding wafers within, and robotic fixtures at each end for automated handling and specially adapted hand-carrying apparatus,
   the handle having a pair of stiff upright legs and leg manipulating means joining upper ends of the legs and spacing the legs to span the wafer carrier end-to-end, each leg including at its lower end wafer carrier attachment means comprising a transverse base perpendicular to the attached leg but parallel to the end of the wafer carrier, a lock-piece at each end of the base bar wherein the improvement is the adaption of the lock-pieces to match and securely interconnect and attach to the standard robotic fixtures of the wafer carrier, each lock-piece having an angular horizontal containment flange having a first extension extending at 90° inward form said base end toward the opposite base and terminating with a second extension, the second extension bending 90° toward the opposite end of the base, thereby forming a substantially U-shaped slot to fit slidably about and contain said automated-usage pickup flange, a flat vertical rest plate formed above said horizontal containment flange for vertically supporting and lifting automated-usage handling slots, and a shaped void recess contained within said horizontal containment flange and below said vertical rest plate for further restraining said automated-usage pickup flanges.

* * * * *